United States Patent [19]
Kurahashi et al.

[11] Patent Number: 5,818,146
[45] Date of Patent: Oct. 6, 1998

[54] SURFACE ACOUSTIC WAVE RESONATOR FILTER APPARATUS

[75] Inventors: Toru Kurahashi, Ishikawa-ken; Kazunobu Shimoe, Kanazawa, both of Japan

[73] Assignee: Murata Manufacturing Co., Ltd., Kyoto-fu, Japan

[21] Appl. No.: 777,361

[22] Filed: Dec. 27, 1996

[30] Foreign Application Priority Data

Dec. 27, 1995 [JP] Japan ..................... 7-340583

[51] Int. Cl.⁶ ............... H01L 41/04; H03H 9/00
[52] U.S. Cl. ............... 310/313 R; 310/313 B; 310/313 D; 333/186; 333/187
[58] Field of Search ............... 310/313 R, 313 B, 310/313 D, 322; 333/193, 186, 187

[56] References Cited

U.S. PATENT DOCUMENTS

| | | | |
|---|---|---|---|
| 4,166,257 | 8/1979 | Subramanian | 333/151 |
| 4,307,356 | 12/1981 | Arai | 333/194 |
| 5,223,762 | 6/1993 | Masaie et al. | 310/313 D |
| 5,521,453 | 5/1996 | Yatsuda | 310/313 R |
| 5,521,565 | 5/1996 | Anemogiannis | 333/195 |
| 5,528,206 | 6/1996 | Watanabe | 333/194 |
| 5,717,367 | 2/1998 | Murai | 333/195 |

Primary Examiner—Mark O. Budd
Assistant Examiner—Timothy A. Williams
Attorney, Agent, or Firm—Graham & James LLP

[57] ABSTRACT

A SAW resonator filter apparatus includes attenuation characteristics which are steep in a frequency region from a pass band to a higher-frequency stop band without experiencing an increase in insertion losses and enlargement of the apparatus. First, second and third SAW resonator filters are disposed on a piezoelectric substrate and are connected in a cascade arrangement to each other. The first and third SAW resonator filters have interdigital electrodes formed of solid electrode fingers, while the second SAW resonator filter disposed between the first and third filters has interdigital electrodes formed of split electrode fingers. With this construction, the steep attenuation characteristics of the response in a higher frequency range appearing in the frequency characteristics of the second SAW resonator filter can be combined with the attenuation characteristics from the pass band to a higher-frequency stop band of the first and third SAW resonator filters. This enables the attenuation characteristics of the pass band in a higher frequency range to become steeper.

4 Claims, 4 Drawing Sheets

SURFACE ACOUSTIC WAVE RESONATOR FILTER APPARATUS

BACKGROUND OF THE INVENTION

1. Field of the Invention

The present invention relates generally to a surface acoustic wave (SAW) resonator filter apparatus which may be used as a bandpass filter in, for example, communication devices. More particularly, the present invention relates to a SAW resonator filter apparatus in which a plurality of SAW resonator filters are connected in a cascade arrangement.

2. Description of the Related Art

Various types of SAW filters are employed as bandpass filters for use in the intermediate frequency (IF) stage of mobile communication devices and the like. The primarily used SAW filters of this type are transversal SAW filters and SAW resonator filters.

In the transversal SAW filters, transmission characteristics and group delay time characteristics can be determined independently, thereby increasing the flexibility of filter design. On the other hand, the transversal SAW filters have a high impedance and thus, have the disadvantage of exhibiting large insertion losses.

In contrast, although the design flexibility of SAW resonator filters is limited, the filters have a comparatively low impedance and can thus hold insertion losses to a small level. Accordingly, the SAW resonator filters are often used as bandpass filters in mobile communication devices and the like.

As digital communication is becoming popular and power saving communication devices are pursued, there is a demand for filters that can exhibit not only small insertion losses, but also for filters that have attenuation characteristics including a steep inclination from a pass band to a stop band. In order to satisfy this demand, an apparatus in which a plurality of SAW resonator filters are provided and connected in a cascade arrangement on a single piezoelectric substrate has been provided.

However, in the above type of filter apparatus, although the steepness of the inclination of the attenuation characteristics in the frequency range from a pass band to a stop band is suitably increased, the inclination of the attenuation characteristics from the pass band to a higher-frequency stop band is not sufficiently steep but is a relatively gradual inclination. In order to overcome this drawback, a larger number of SAW resonator filters must be connected in a cascade arrangement to achieve much steeper attenuation characteristics in the frequency range from a pass band to a stop band, in particular, to a stop band located on the higher frequency side.

However, a greater number of connections, i.e., the stage number, of SAW resonator filters inevitably increases the chip size and further enlarges the overall size of the filter apparatus. What is worse, insertion losses are dramatically increased because of the large number of SAW resonators that are required to achieve the desired steeper attenuation characteristics. Consequently, a restriction is imposed on the above-described method in which a larger number of SAW resonator filters are connected in a cascade arrangement because of an increase in insertion losses and enlargement in the chip size and apparatus.

SUMMARY OF THE INVENTION

The preferred embodiments of the present invention overcome the problems with conventional devices as described above by providing a SAW resonator filter apparatus exhibiting steep attenuation characteristics from a pass band to a stop band without incurring substantially increased insertion losses or enlargement in size, and being free from the aforementioned problems inherent in the SAW resonator filter apparatus in which a plurality of SAW resonator filters are connected in a cascade arrangement.

According to one preferred embodiment of the present invention, there is provided a surface acoustic wave (SAW) resonator filter apparatus comprising a plurality of SAW resonator filters which are connected to each other in cascade arrangement, the filters comprising: a piezoelectric substrate or a piezoelectric substrate covered with a thin piezoelectric film (hereinafter referred to as a "quasi-piezoelectric substrate); a plurality of interdigital (hereinafter simply referred to as "ID") electrodes disposed on the piezoelectric substrate or disposed to contact the thin piezoelectric film; and first and second grating reflectors disposed at both sides of the plurality of ID electrodes in directions in which the surface acoustic waves propagate, wherein the ID electrodes of at least one of the SAW resonator filters comprises split electrode fingers, while the ID electrodes of another of the SAW resonator filters comprise solid electrode fingers.

In the present specification, the terms "solid electrode fingers" and "split electrode fingers" are defined as follows. The solid electrode fingers are basically constructed in such a manner that they preferably have about a $\lambda/4$ width and about a $\lambda/4$ gap between the fingers when the wavelength of propagating surface acoustic waves is determined to be $\lambda$, and that the electrode fingers alternately connected to the different potentials are disposed in directions in which the surface acoustic waves propagate. In contrast, the split electrode fingers are equivalent to electrode fingers formed by splitting the above-described normal type of a solid electrode finger into two fingers. More particularly, the split electrode fingers are fundamentally constructed to have about a $\lambda/8$ width and about a $\lambda/8$ pitch between a pair of split fingers when the wavelength of excited and received surface acoustic waves is determined to be $\lambda$. A pair of split electrode fingers are preferably connected to the same potential and are thus equivalent to one solid electrode finger. Further, the center pitch between a pair of split electrode fingers and an adjacent pair of split electrode fingers is determined to be about $\lambda/2$. It should be noted that the above-described configuration is not limiting, and the width of the electrode fingers may be modified to deviate from about $\lambda/4$ or about $\lambda/8$, and such modifications are entirely within the scope of the present invention.

Although split electrode fingers are known, such conventional split electrode fingers used in ID electrodes have only produced disadvantageous results which have not been able to be overcome or eliminated. That is, the conventional split finger electrodes have not been able to be used advantageously for forming ID electrodes or to produce desired filter characteristics in a SAW resonator without also generating unacceptable and undesired filter characteristics.

The inventors of the present application discovered a novel and unique arrangement for using split finger electrodes and solid finger electrodes for forming a SAW resonator. This novel and unique arrangement avoids or eliminates the disadvantages produced in conventional arrangements of split finger electrodes and achieves desired and improved filter characteristics. The novel arrangement of the preferred embodiments of the present invention is the result of the inventors' discovery that combining and connecting a split finger electrode ID and a solid finger electrode ID in a unique manner achieves substantially improved filter characteristics including a greatly decreased filter loss and reduced size of the overall SAW resonator as compared with conventional SAW resonators in which ID electrodes are connected to each other in a cascade arrangement.

As illustrated in FIG. 3 which will be referred to in the following description of a preferred embodiment of the present invention, a plurality of responses appear in the frequency characteristics of a SAW resonator filter having ID electrodes comprised of split electrode fingers. Between the largest and second largest responses, the response positioned within the higher frequency range has very steep attenuation characteristics on the higher frequency side.

Accordingly, the SAW resonator filter having ID electrodes comprising split electrode fingers is connected in a cascade arrangement to the SAW resonator filters formed with ID electrodes comprising solid electrode fingers. With this novel and unique arrangement, the pass-band attenuation characteristics of the SAW resonator filter comprising solid electrode fingers can be combined with the steep attenuation characteristics of the above-described response located in a higher frequency range of the SAW resonator filter having split electrode fingers and the previously unavoidable disadvantageous filter characteristics produced by the split finger electrodes are eliminated. As a result, the inclination of the attenuation characteristics of the frequency range from the pass band to a stop band located on the higher frequency side within the pass band is made steeper.

According to the SAW resonator filter apparatus of the preferred embodiments of the present invention, a desired pass band can be achieved by virtue of the SAW resonator filter having ID electrodes comprising solid electrode fingers. Also, the attenuation characteristics of the frequency range from a pass band to a stop band positioned on the higher frequency side within the pass band can be made steeper because of the SAW resonator filter formed with ID electrodes comprising split electrode fingers. The unique combination and arrangement of the solid electrode fingers and the split electrode fingers achieves the improved filter characteristics described above while also avoiding the disadvantageous filter characteristics produced by conventional uses of split electrode fingers.

Hence, more preferably, in order to use the above-described response appearing in a higher frequency range, the characteristics of both types of the SAW resonator filters are determined so that the attenuation characteristics of the response appearing in a higher frequency range of the SAW resonator filter using split electrode fingers can coincide with the frequency range from a pass band to a stop band located on the higher frequency side within the pass band of the SAW resonator filter containing solid electrode fingers.

In this manner, various methods are available to set the filter characteristics of a plurality of SAW resonator filters. According to a specific aspect of the preferred embodiments of the present invention, the finger pitch of the ID electrodes comprising split electrode fingers may be set to be greater than that of the reflectors corresponding to the electrodes. With this construction, as will be clarified in the following preferred embodiment of the present invention, the steep attenuation characteristics of the SAW resonator filter having ID electrodes formed with split electrode fingers can overlap the frequency region from the pass band to a stop band located in a higher frequency of the SAW resonator filter having ID electrodes formed with solid electrode fingers. It is thus possible to reliably provide a SAW resonator filter apparatus exhibiting steep attenuation characteristics for the frequency range from a pass band to a higher-frequency stop band.

According to the above description, for the SAW resonator filter apparatus of the preferred embodiments of the present invention, the above-described advantages can be achieved by connecting the SAW resonator filter having split electrode fingers to the SAW resonator filter having solid electrode fingers in a cascade arrangement. In the preferred embodiments of the present invention, the number of the respective types of SAW resonator filters may be one or greater. More specifically, it is most preferable that at least one SAW resonator filter having split electrode fingers and at least one SAW resonator filter having solid electrode fingers be provided.

According to another preferred embodiment of the present invention, the above-described plurality of SAW resonator filters may be comprised of first, second and third SAW resonator filters which are connected to each other in a cascade arrangement. The ID electrodes of the first and third SAW resonator filters may be formed with solid electrode fingers, while the ID electrodes of the second SAW resonator filter connected between the first and third filters may be constructed of split electrode fingers. In this case, the impedance viewed from the input terminal is equal to the impedance viewed from the output terminal, thereby easily attaining impedance matching.

Further, the SAW resonator filter apparatus of the preferred embodiments of the present invention comprises at least one SAW resonator filter having split electrode fingers and at least one SAW resonator filter having solid electrode fingers, both of the filters being connected to each other in a cascade arrangement. The SAW resonator filters may preferably be disposed on a single piezoelectric substrate or a quasi-piezoelectric substrate. Thus, a filter exhibiting steep attenuation characteristics in the frequency range from a pass band to a higher-frequency stop band can be provided as a single unitary device.

Additionally, as the piezoelectric substrate, piezoelectric single crystals, such as $LiTaO_3$, $LiNbO_3$, quartz, and piezoelectric ceramics, such as lead zircotitanate piezoelectric ceramics, may be used. Also, as the quasi-piezolelectric substrate, a thin piezoelectric film may be deposited on a substrate formed from an insulating material, such as alumina. Alternatively, a thin piezoelectric film may be further formed on the above-described piezoelectric substrate. A thin film formed of ZnO, $Ta_2O_5$, $SiO_2$ or the like, may be used as the above-described thin piezoelectric film.

Moreover, a plurality of ID electrodes forming the SAW resonator filters are preferably provided on the afore-described piezoelectric substrate or arranged to contact the thin piezoelectric film. In the latter case, a plurality of ID electrodes may be disposed on the upper surface of the thin piezoelectric film, or they may be disposed on the lower surface of the film, i.e., at the interface between the substrate and the film.

Also, the first and second grating reflectors, as well as the ID electrodes, are preferably disposed on the piezoelectric substrate or disposed to contact the thin piezoelectric film. The above ID electrodes and grating reflectors may be formed of any metallic material. Al or Al alloys which are normally used in SAW apparatuses are, in general, employed.

These and other elements, features and advantages of the preferred embodiments of the present invention will be apparent from the following detailed description of the preferred embodiments of the present invention, as illustrated in the accompanying drawings.

DETAILED DESCRIPTION OF PREFERRED EMBODIMENTS

Figure 1:
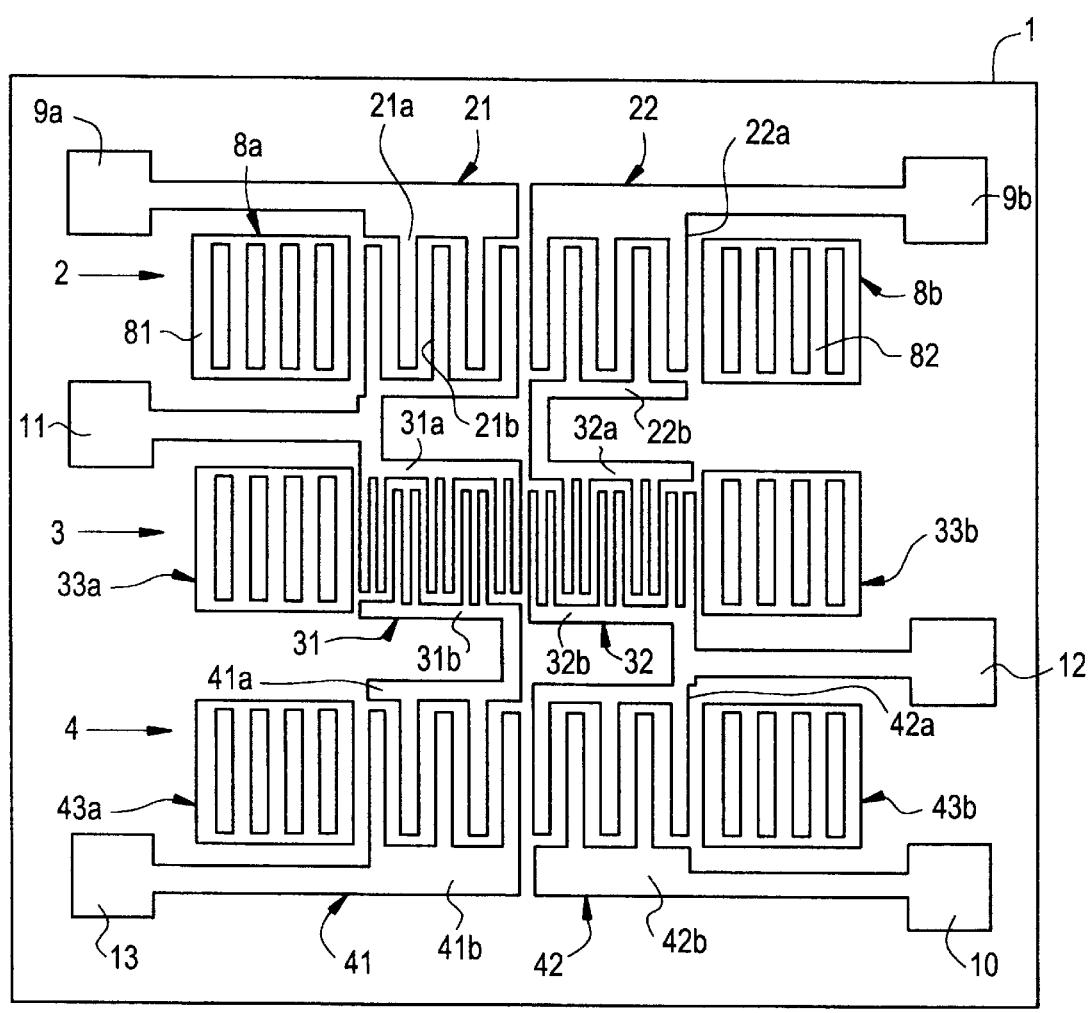
FIG. 1 is a plan view of a SAW resonator filter apparatus according to a preferred embodiment of the present invention.

FIG. 1 is a schematic plan view of a SAW resonator filter apparatus according to a preferred embodiment of the present invention. The SAW resonator filter apparatus of this preferred embodiment is preferably constructed by the use of a substantially rectangular piezoelectric substrate 1. The piezoelectric substrate 1 is preferably formed from a 36°-Y-cut X-direction-propagating $LiTaO_3$ substrate. A X-cut 112° Y-direction-propagating $LiTaO_3$ substrate or a 64° Y-cut X-direction-propagating $LiNbO_3$ substrate may also be used instead. Other suitable substrates may also be used.

Disposed on the substrate 1 are various types of ID electrodes and reflectors, which are preferably formed of aluminum alloys obtained by adding copper to aluminum, thereby constructing three-stage SAW resonator filters 2, 3 and 4. The ID electrodes and reflectors will be explained in detail below. A thin $SiO_2$ film is preferably deposited on the entire surface of the piezoelectric substrate 1 by means of sputtering or other suitable process, though it is not shown, so as to cover the various above-described electrodes, except for the region where an electrode pad for establishing a connection with external electronic components is located.

In the SAW resonator filter 2, ID electrodes 21 and 22 are preferably formed at substantially the center of the filter 2 and extend in directions in which the surface acoustic waves propagate. The ID electrode 21 is preferably formed of a pair of comb-like electrodes 21a and 21b, while the ID electrode 22 is preferably constituted of a pair of comb-like electrodes 22a and 22b. The comb-like electrodes 21a and 21b each have a plurality of solid electrode fingers which are interdigitated with each other. Similarly, the comb-like electrodes 22a and 22b each have a plurality of solid electrode fingers which are interdigitated with each other.

Grating reflectors 8a and 8b are preferably disposed on both sides of the exterior of the ID electrodes 21 and 22, respectively. The grating reflectors 8a and 8b have a plurality of electrode fingers 81 and 82, respectively, that extend in directions which are substantially perpendicular to the directions in which the surface acoustic waves propagate.

The comb-like electrode 21a, which is an electrode of the ID electrode 21, is electrically connected to an electrode pad 9a serving as an input electrode, while the comb-like electrode 21b is electrically coupled to an electrode pad 11 which is grounded. Further, the comb-like electrode 22a is electrically connected to an electrode pad 9b which is grounded.

In the second SAW resonator filter 3, ID electrodes 31 and 32 are preferably disposed at substantially the center of the filter 3 and extend in the directions in which the surface acoustic waves propagate. The ID electrode 31 is preferably formed of a pair of comb-like electrodes 31a and 31b, while the ID electrode 32 is preferably constituted of a pair of comb-like electrodes 32a and 32b. The comb-like electrodes 31a and 31b each have a plurality of split electrode fingers, the fingers of the respective electrodes 31a and 31b forming pairs which are interdigitated with each other. Likewise, the comb-like electrodes 32a and 32b are preferably formed with a plurality of split electrode fingers.

Grating reflectors 33a and 33b are preferably located on both sides of the ID electrodes 31 and 32 and extend in the directions in which the surface acoustic waves propagate. The grating reflectors 33a and 33b, as well as the grating reflectors 8a and 8b, are constructed with a plurality of electrode fingers.

The comb-like electrode 31a is connected to the comb-like electrode 21b of the first SAW resonator filter 2 through the use of a conductive pattern and is electrically connected to the above-described electrode pad 11 which is grounded. The comb-like electrode 32a is electrically coupled to the comb-like electrode 22b of the first filter 2. The comb-like electrode 31b is electrically connected to the third SAW resonator filter 4, while the comb-like electrode 32b is electrically coupled via a conductive pattern to an electrode pad 12 which is grounded.

The third SAW resonator filter 4 is preferably constructed in a manner similar to the first SAW resonator filter 2. More specifically, ID electrodes 41 and 42 are preferably provided with solid electrode fingers and are preferably disposed at substantially the center of the filter 4. The ID electrode 41 has a pair of comb-like electrodes 41a and 41b, while the ID electrode 42 has a pair of comb-like electrodes 42a and 42b, all of the electrode fingers 41a through 42b preferably being solid electrode fingers. Moreover, reflectors 43a and 43b each having a plurality of electrode fingers preferably are disposed at both sides of the ID electrodes 41 and 42 and extend in the directions in which the surface acoustic waves propagate.

The comb-like electrode 41a is electrically connected to the comb-like electrode 31b of the second SAW resonator filter 3, while the comb-like electrode 41b is electrically coupled by means of a conductive pattern to an electrode pad 13 which is grounded. The comb-like electrode 42a is connected to the comb-like electrode 32b through the use of a conductive pattern and is further electrically coupled to an electrode pad 12, while the comb-like electrode 42b is electrically connected via a conductive pattern to an electrode pad 10 which is used as an output electrode.

Although the SAW resonator filter apparatus of this preferred embodiment has the first, second and third SAW resonator filters 2, 3 and 4, the filter 2 or 4 may be omitted. Alternatively, at least one SAW resonator filter having solid electrode fingers and/or at least one SAW resonator filter provided with split electrode fingers may be further connected in a cascade arrangement to the first through third filters 2 through 4. This makes it possible to achieve steeper attenuation characteristics over a range from a pass band to a stop band located on the higher frequency side within the pass band.

An explanation will now be given with reference to FIGS. 2 through 4 of the reason why the attenuation characteristics of a higher-frequency pass band become steeper in the SAW resonator filter apparatus shown in FIG. 1.

Figure 2:
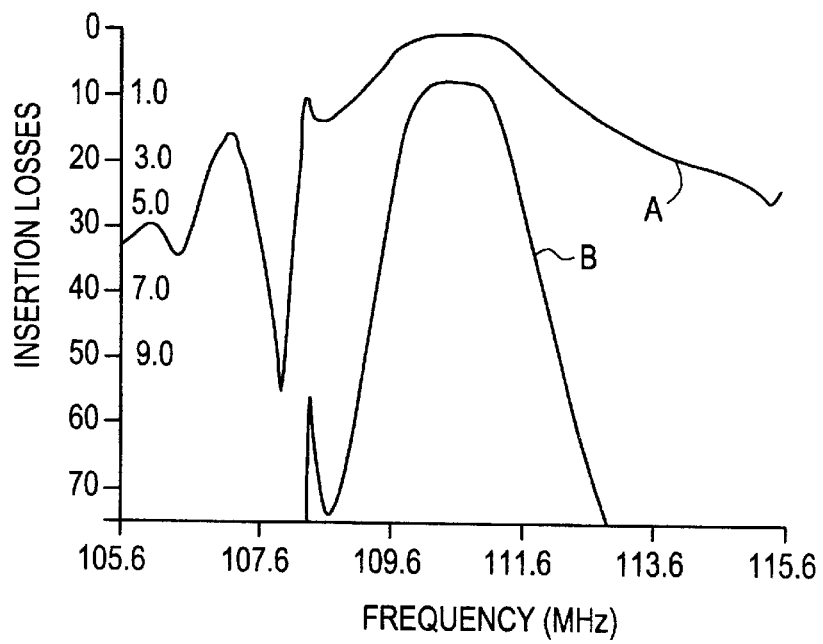
FIG. 2 is a diagram illustrating the frequency characteristics of the filter apparatus shown in FIG. 1 constructed of a one-stage SAW resonator filter formed with solid electrode fingers.

FIG. 2 illustrates the frequency characteristics resulting from the use of only the first SAW resonator filter 2, i.e., by use of a one-stage SAW resonator filter formed of ID electrodes having solid electrode fingers. Referring to FIG. 2, the solid line B illustrates the frequency characteristics in which the insertion losses-versus-frequency characteristics indicated by the solid line A are partially enlarged according to a scale shown on the right-hand side of the vertical axis.

Figure 3:
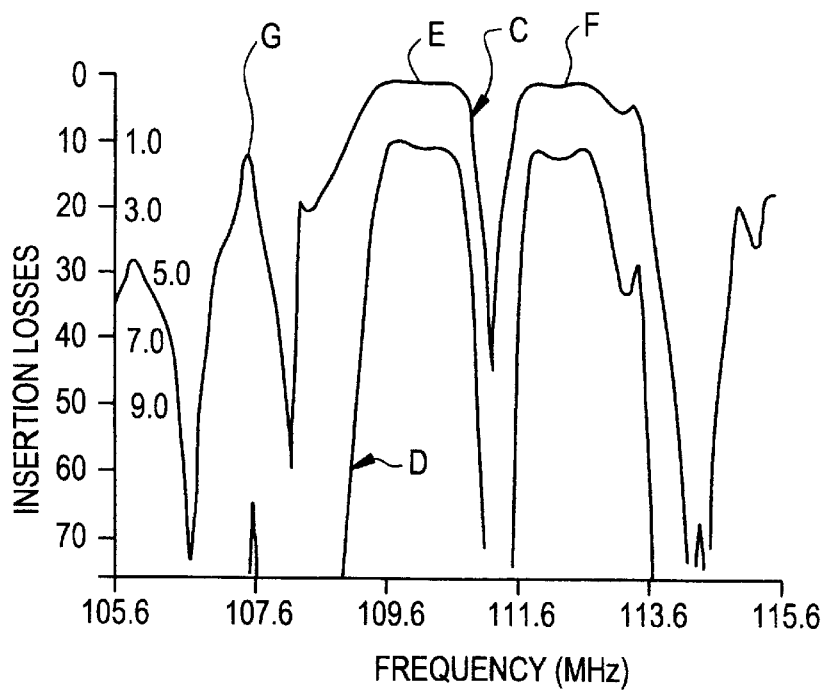
FIG. 3 is a diagram illustrating the frequency characteristics of a one-stage SAW resonator filter formed with split electrode fingers.

Further, FIG. 3 illustrates the frequency characteristics resulting from the use of only the second SAW resonator filter 3, i.e., by use of a one-stage SAW resonator filter formed of ID electrodes with split electrode fingers. In FIG. 3, the solid line D illustrates the frequency characteristics in which the essential portion of the characteristics indicated by the solid line C is enlarged according to a scale indicated on the right-hand side of the vertical axis designating insertion losses.

FIG. 3 clearly shows that two large responses E and F and one small response G appear from the use of the second SAW resonator filter 3. In this case, for the effective use of a large response E appearing at the center of the frequency characteristics, it is necessary to attenuate unwanted responses F and G. It is difficult, however, to sufficiently attenuate both of the responses F and G simply by changing the design conditions of the SAW resonator filter.

In contrast, if it is desired that the response F be used, it is easy to attenuate unwanted responses E and G. More specifically, for example, if the ratio of the finger pitch of the ID electrodes having split electrode fingers to the finger pitch of the reflectors is increased to approximately 1.024, the response E can be shifted to the edge of the stop band of the reflectors and can thus be suppressed to a lower level, as illustrated in FIG. 4.

Figure 4:
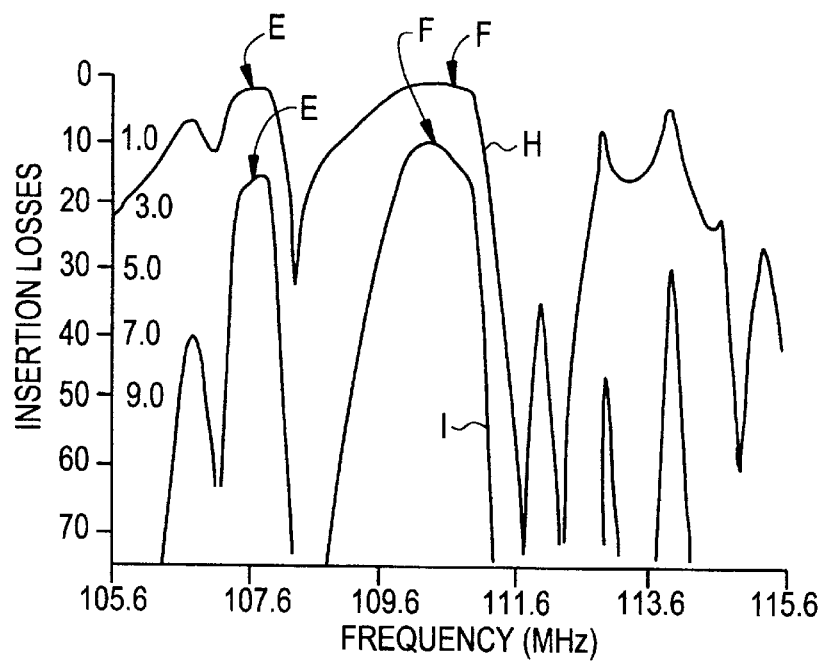
FIG. 4 is a diagram illustrating the frequency characteristics of a SAW resonator filter having split electrode fingers with a finger pitch ratio determined at about 1.024 in order to utilize the response F of the frequency characteristics shown in FIG. 3.

FIG. 4 illustrates the frequency characteristics of the SAW resonator filter having split electrode fingers which are modified as described above. In FIG. 4, the solid line I illustrates the characteristics in which the essential portion of the frequency characteristics indicated by the solid line H is enlarged according to a scale shown on the right-hand side of the vertical axis representing insertion losses.

As discussed above, in the SAW resonator filter provided with split electrode fingers, for the effective use of the response F appearing in the highest frequency range among the three responses E, F and G, the unwanted responses E and G can be readily suppressed by increasing the aforedescribed finger pitch ratio, more specifically, increasing the ratio to greater than about one.

In this manner, the above-described finger ratio can be controlled, as illustrated in FIG. 4, to implement the response F having the steep attenuation characteristics in a higher frequency range. Consequently, the frequency of the response E can match the frequency of the attenuation pole in the higher range of the frequency characteristics shown in FIG. 2, thereby preventing the response E from remaining in a lower frequency range of the pass band as an unwanted spurious response.

According to the above description, in the SAW resonator filter apparatus of this preferred embodiment, the SAW resonator filter 3 formed with the use of split electrode fingers having the frequency characteristics, for example, as shown in FIG. 4, is connected in a cascade arrangement to the SAW resonator filters 2 and 4 constituted with solid electrode fingers exhibiting the frequency characteristics, for example, as illustrated in FIG. 2. This makes it possible to obtain frequency characteristics in which attenuation characteristics are steeper in a higher frequency range within the pass band.

In SAW resonator filters using solid electrode fingers, the above-described finger pitch ratio is modified to slightly less than about one. This is due to the following reason. The radiation conductance peak of IDTs comprising solid electrode fingers is located in a frequency range that is lower than IDTs using split electrode fingers. Accordingly, if the finger pitch ratio of the solid electrode fingers is set to greater than about one, the radiation conductance peak extends beyond the stop band, thereby failing to implement desired filter characteristics.

The preferred embodiments of the present invention will now be described through illustrations of specific examples with reference to FIGS. 5 and 6. More specifically, an explanation will now be given, while referring to FIGS. 5 and 6, of the frequency characteristics obtained by applying the SAW resonator filter apparatus of the preferred embodiments of the present invention to an IF filter for use in the European digital cordless telephone system (DECT).

As well as the preferred embodiment shown in FIG. 1, the SAW resonator filter apparatus used in this example was constructed of the first SAW resonator filter 2 formed of solid electrode fingers, the second SAW resonator filter 3 provided with split electrode fingers, and the third SAW resonator filter 4 formed with solid electrode fingers, with filters 2, 3 and 4 being connected in a cascade arrangement to each other in that order. In this configuration, since the input and output terminals of the overall filter are symmetrical with each other, the impedance viewed from the input terminal is the same as the impedance viewed from the output terminal, thereby easily achieving impedance matching.

In this example, the various above-described electrodes were formed on the upper surface of a 36° Y-cut X-direction-propagating $LiTaO_3$ substrate, and then a thin $SiO_2$ film was formed on the entire surface of the substrate (except for an electrode pad for establishing a connection with the exterior). A piezoelectric substrate 1 was thus produced. For the electrodes of the SAW resonator filters 2 through 4, alloys formed by adding copper to aluminum as described above were used. The ID electrodes 21, 22, 41 and 42 preferably have 11 pairs of solid electrode fingers, while the ID electrodes 31 and 32 preferably have 25 pairs of split electrode fingers. The apertures of all of the ID electrodes 21, 22, 31, 32, 41 and 42 were about 400 $\mu$m. Further, the electrode finger pitch ratio of the SAW resonator filters 2 and 4, i.e., the ratio of the finger pitch of the ID electrodes to that of the grating reflectors, was set to about 0.968, while the finger pitch ratio of the SAW resonator filter 3 was determined at about 1.024.

Figure 5:
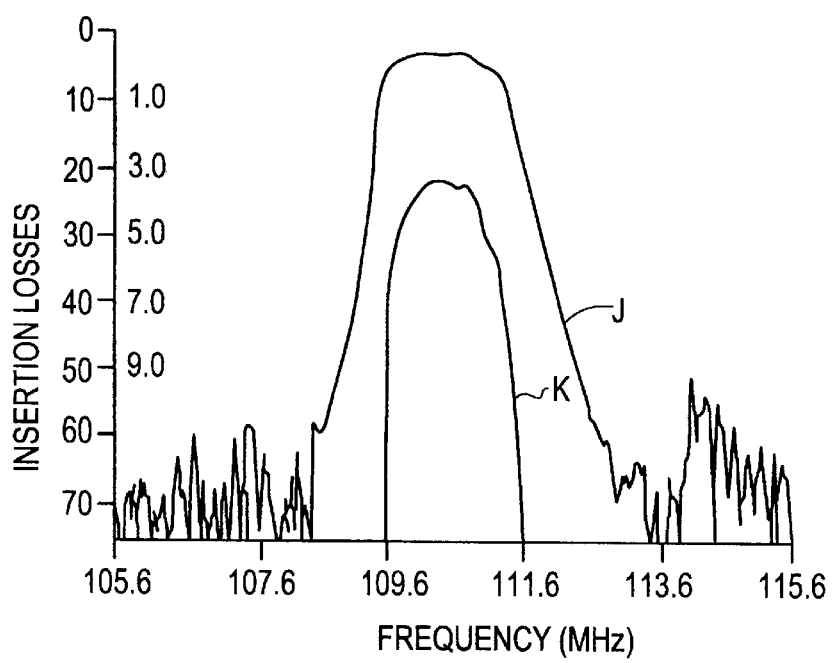
FIG. 5 is a diagram illustrating the frequency characteristics of three-stage cascade-connected SAW resonator filters having solid electrode fingers.

FIG. 5 illustrates the frequency characteristics of the three-stage filter IDTs using solid electrode fingers that are connected in a cascade arrangement to each other. In FIG. 5, the solid line K indicates the characteristics in which the essential portion of the frequency characteristics indicated by the solid line J is enlarged according to a scale shown on the right-hand side of the vertical axis representing insertion losses. FIG. 6 illustrates the overall frequency characteristics of the three-stage SAW resonator filter apparatus constructed as described above. In FIG. 6, the solid line M illustrates the characteristics in which the essential portion of the characteristics indicated by the solid line L is enlarged according to a scale shown on the right-hand side of the vertical axis designating insertion losses.

Figure 6:
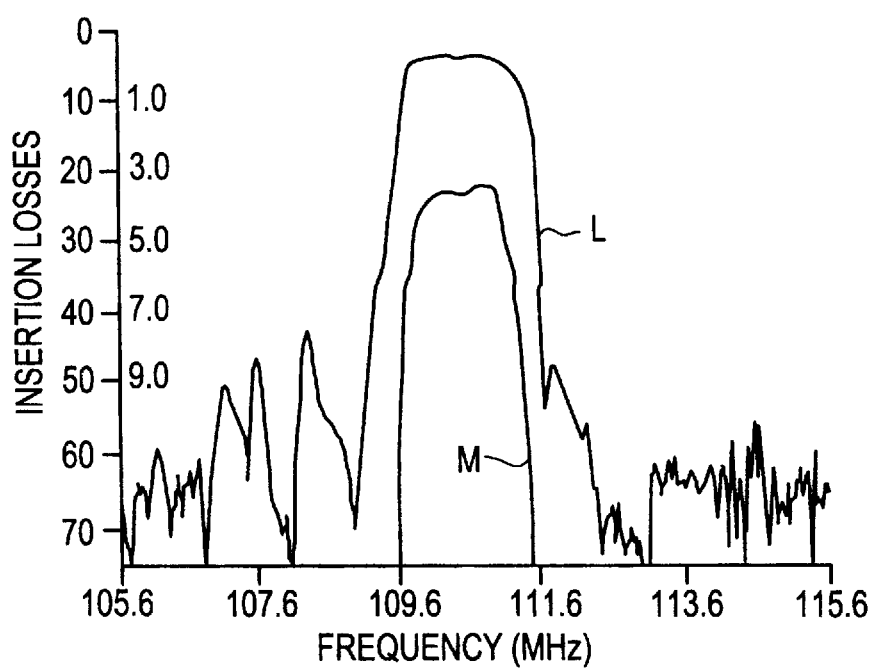
FIG. 6 is a diagram illustrating the overall frequency characteristics of a SAW resonator filter apparatus according to one preferred embodiment of the present invention.

By comparing FIGS. 5 and 6, it is revealed that the attenuation characteristics in a higher frequency range within the pass band indicated by the solid lines L and M of FIG. 6 become very steep.

As will be clearly understood from the foregoing description, the preferred embodiments of the present invention offers the following advantages.

In the SAW resonator filter apparatus constructed by connecting a plurality of SAW resonator filters in a cascade arrangement, at least one filter has ID electrodes comprising split electrode fingers, and at least one filter has ID electrodes comprising solid electrode fingers. With this arrangement, the attenuation characteristics in a region from a pass band to a higher-frequency stop band of the SAW resonator filters having solid electrode fingers are improved by the steep attenuation response characteristics in a higher frequency range of the SAW resonator filter using split electrode fingers. In this manner, a SAW resonator filter formed with split electrode fingers is connected in a cascade arrangement to SAW filters having solid electrode fingers, thereby enabling the attenuation characteristics of a pass band at a higher frequency range to become steeper. Thus, the preferred embodiments of the present invention are advantageous over known types of filter devices in which the number of connecting stages of the filters is merely increased in order to achieve steeper attenuation characteristics, because steep attenuation characteristics are obtained with the preferred embodiments of the present invention without seriously incurring increased insertion losses and enlargement in the overall filter apparatus.

Further, according to a specific aspect of the preferred embodiments of the present invention, the electrode finger ratio of the SAW resonator filter, i.e., the ratio of the finger pitch of the split electrode fingers to that of the reflectors, is set to be greater than about one. With this arrangement, between the two large responses appearing in the frequency characteristics of the SAW resonator filter formed with split electrode fingers, the response in the higher frequency range can be reliably used. As a result, the attenuation characteristics of a pass band in a higher frequency range can become positively steep.

Additionally, according to another specific aspect of the preferred embodiments of the present invention, in a SAW resonator filter apparatus in which first, second and third SAW resonator filters are connected to each other in a cascade arrangement, the second SAW resonator filter disposed between the first and third filters is preferably formed with split electrode fingers, while the first and third filters across the second filter are preferably constructed with solid electrode fingers. With this arrangement, the impedance viewed from the input terminal of the apparatus is the same as the impedance viewed from the output terminal, thereby readily achieving impedance matching.

While the invention has been particularly shown and described with reference to preferred embodiments thereof, it will be understood by those skilled in the art that the foregoing and other changes in form and details may be made therein without department from the spirit and scope of the invention.

What is claimed is:

1. A surface acoustic wave resonator filter apparatus comprising:

a plurality of surface acoustic wave resonator filters being connected to each other in a cascade arrangement;

each of said surface acoustic wave filters including:
one of a piezoelectric substrate and a quasi-piezoelectric substrate which includes an insulating substrate and a thin piezoelectric film disposed on said insulating substrate;
a plurality of interdigital electrodes being one of disposed on said piezoelectric substrate and disposed to contact said thin piezoelectric film; and
first and second grating reflectors disposed at both sides of said plurality of interdigital electrodes and extending in directions in which surface acoustic waves propagate, wherein
the interdigital electrodes of at least one of said surface acoustic wave resonator filters comprise split electrode fingers and the interdigital electrodes of another of said surface acoustic wave filters comprise solid electrode fingers.

2. A surface acoustic wave resonator filter apparatus according to claim 1, wherein a finger pitch of the split electrode fingers of at least one of said interdigital electrodes of said surface acoustic wave resonator filters is set to be greater than a finger pitch of said grating reflectors to use a filter response positioned within a higher frequency range between a largest filter response and a second largest filter response appearing in frequency characteristics of said surface acoustic wave resonator filter apparatus.

3. A surface acoustic wave resonator filter apparatus according to claim 1, wherein said plurality of surface acoustic wave resonator filters comprise first, second and third surface acoustic wave resonator filters which are connected in a cascade arrangement to each other, and the interdigital electrodes of said first and third surface acoustic wave resonator filters include solid electrode fingers and the interdigital electrodes of said second surface acoustic wave resonator filter connected between said first and third surface acoustic wave resonator filters include split electrode fingers.

4. A surface acoustic wave resonator filter apparatus according to claim 1, wherein said plurality of surface acoustic wave resonator filters are disposed directly on one of said single piezoelectric substrate and said quasi-piezolelectric substrate.

* * * * *